US011223074B2

(12) United States Patent
Remboski et al.

(10) Patent No.: US 11,223,074 B2
(45) Date of Patent: Jan. 11, 2022

(54) BATTERY CELL MONITORING SYSTEM (71) Applicants: Neapco Intellectual Property Holdings, LLC, Farmington Hills, MI (US); Aware Mobility LLC, Ann Arbor, MI (US)

(72) Inventors: Donald Remboski, Ann Arbor, MI (US); Jacqueline Dedo, Wolverine Lake, MI (US)

(73) Assignee: NEAPCO INTELLECTUAL PROPERTY HOLDINGS, LLC, Farmington Hills, MI (US)

( * ) Notice: Subject to any disclaimer, the term of this patent is extended or adjusted under 35 U.S.C. 154(b) by 574 days.

(21) Appl. No.: 16/159,958

(22) Filed: Oct. 15, 2018

(65) Prior Publication Data
US 2019/0115635 A1 Apr. 18, 2019

Related U.S. Application Data (60) Provisional application No. 62/572,654, filed on Oct. 16, 2017.

(51) Int. Cl.
*H01M 10/48* (2006.01)
*G01R 31/382* (2019.01)
(Continued)

(52) U.S. Cl.
CPC ........ *H01M 10/482* (2013.01); *G01R 31/382* (2019.01); *G01R 31/389* (2019.01); *G01R 31/396* (2019.01); *G01R 19/16542* (2013.01)

(58) Field of Classification Search
CPC ............. H01M 10/482; H01M 10/425; H01M 10/4257
(Continued)

(56) References Cited

U.S. PATENT DOCUMENTS 3,559,106 A * 1/1971 Grindon ................... H03C 1/60
332/152
5,546,003 A 8/1996 Noworolski et al.
(Continued)

FOREIGN PATENT DOCUMENTS

EP 2413152 A1 2/2012
EP 3037830 A1 6/2016
(Continued)

OTHER PUBLICATIONS

Definition of varactor, Electroschematics, printed Apr. 9, 2021. (Year: 2021).*
(Continued)

*Primary Examiner* — Michael P Nghiem
(74) *Attorney, Agent, or Firm* — Dickinson Wright PLLC (57) ABSTRACT A battery cell monitoring system and method of operating the battery cell monitoring system are provided. The system includes a sense line. A plurality of cell sense units each include a tank circuit having a center frequency and are electrically connected to the sense line. A cell sense reader unit electrically couples to the sense line and includes a variable frequency radio frequency generator for outputting a radio frequency signal having a signal frequency that is variable to the plurality of cell sense units. The cell sense reader unit measures an impedance of the sense line as the signal frequency varies and determines the center frequency of each of the cell sense units. The cell sense reader unit is also configured to determine a cell voltage of each battery cell electrically connected to one of the plurality of cell sense units based on the center frequency determined.

20 Claims, 4 Drawing Sheets (51) Int. Cl.
*G01R 31/389* (2019.01)
*G01R 31/396* (2019.01)
*G01R 19/165* (2006.01)

(58) Field of Classification Search
USPC .......................................................... 702/63
See application file for complete search history.

(56) References Cited

U.S. PATENT DOCUMENTS

| | | | |
|---|---|---|---|
| 7,593,822 | B2 | 9/2009 | Stewart |
| 7,598,709 | B2 * | 10/2009 | Guang ................. H02J 7/0077 |
| | | | 320/135 |
| 8,581,547 | B2 | 11/2013 | Hoff |
| 9,213,067 | B2 | 12/2015 | Buzon et al. |
| 9,261,568 | B2 | 2/2016 | Parle et al. |
| 9,316,694 | B2 | 4/2016 | Campbell et al. |
| 9,448,287 | B2 | 9/2016 | Okada et al. |
| 2006/0139008 | A1 | 6/2006 | Park |
| 2007/0108992 | A1 | 5/2007 | Yanagisawa |
| 2009/0058370 | A1 * | 3/2009 | Odaohhara ....... H02J 7/007194 |
| | | | 320/152 |
| 2010/0060295 | A1 | 3/2010 | Ishikawa et al. |
| 2010/0090540 | A1 | 4/2010 | Tanaka et al. |
| 2011/0074431 | A1 | 3/2011 | Li |
| 2011/0273023 | A1 | 11/2011 | Nishida et al. |
| 2013/0026994 | A1 | 1/2013 | Morikawa |
| 2013/0229156 | A1 | 9/2013 | Brandon et al. |
| 2013/0300426 | A1 | 11/2013 | Butzmann |
| 2014/0159735 | A1 | 6/2014 | Buzon et al. |
| 2014/0368209 | A1 | 12/2014 | Henrici |
| 2016/0226276 | A1 * | 8/2016 | Iwasawa ................ H01M 10/48 |
| 2019/0115636 | A1 * | 4/2019 | Remboski ............ G01R 31/396 |

FOREIGN PATENT DOCUMENTS

| | | |
|---|---|---|
| JP | H06233473 A | 8/1994 |
| JP | H06233474 A | 8/1994 |
| JP | 2004157077 A | 6/2004 |
| WO | 2002095897 A3 | 11/2002 |
| WO | 2014156263 A1 | 10/2014 |
| WO | 2017155272 A1 | 9/2017 |

OTHER PUBLICATIONS

Inductor, Electrical and Electronic Engineering, Jan. 2013. (Year: 2013).*
Soclof, "How Circuits Work", pp. 1-3, 2008. (Year: 2008).*
"Home of RF and Wireless Vendors and Resources", pp. 1-5, 2012. (Year: 2012).*
International Search Report; PCT/US2018/055982; 10 pages; dated Jan. 7, 2019.
International Search Report; PCT/US2018/055980; 6 pages; dated Feb. 6, 2019.

* cited by examiner

BATTERY CELL MONITORING SYSTEM

CROSS REFERENCE TO RELATED APPLICATIONS

This utility application claims the benefit of U.S. Provisional Application No. 62/572,654 filed Oct. 16, 2017. The entire disclosure of the above application is incorporated herein by reference.

FIELD

The present disclosure relates generally to a battery cell monitoring system for battery having a plurality of battery cells. The present disclosure also relates to a method of operating the battery cell monitoring system.

BACKGROUND

This section provides background information related to the present disclosure which is not necessarily prior art.

Batteries are commonly used on a myriad of different applications, from portable electronic devices to electric and hybrid vehicles. Vehicle batteries, for example, include numerous battery cells and may include battery monitoring systems. Typical battery monitoring systems monitor overall battery temperature, voltage and current and will sometimes monitor these parameters on a "module" level. A module is a subset of multiple battery cells in the battery connected in such a way that the parameters can be measured for the module alone.

Nevertheless, monitoring at the battery level or module level does not give the best insight into the performance of each individual cell in the battery. This is particularly true when the number of cells in the module or battery is large. With parameters from a large number of cells combined in a bulk measurement, small changes in individual cells are difficult to discern. Accordingly, there remains a need for an improved battery cell monitoring system.

SUMMARY

This section provides a general summary of the present disclosure and is not a comprehensive disclosure of its full scope or all of its features and advantages.

It is an object of the present disclosure to provide battery cell monitoring system that addresses and overcomes the above-noted shortcomings.

Accordingly, it is an aspect of the present disclosure to provide a battery cell monitoring system for a battery having a plurality of battery cells. The battery cell monitoring system includes a sense line and a plurality of cell sense units each including a tank circuit are electrically connected to one of the plurality of battery cells and to the sense line. Each of tank circuit has a center frequency dependent on a cell parameter of interest of the one of the plurality of battery cells. The battery cell monitoring system also includes a cell sense reader unit electrically coupled to the plurality of cell sense units through the sense line and configured to determine the center frequency of the tank circuit of each of the plurality of cell sense units and consequently determine the cell parameter of interest of each of the plurality of battery cells. The tank circuit of each of the plurality of cell sense units includes a varactor electrically connected with the one of the plurality of battery cells for providing a varying variable varactor capacitance dependent upon the cell parameter of interest of the one of the plurality of battery cells and at least one inductor connected in series with the one of the plurality of battery cells between the one of the plurality of battery cells and the varactor.

According to another aspect of the disclosure, a cell sense unit of a battery cell monitoring system for a battery cell of a battery is also provided. The cell sense unit includes a tank circuit having a center frequency and includes a positive battery node for coupling to a positive terminal of one of the plurality of battery cells and a negative battery node for coupling to a negative terminal of the one of the plurality of battery cells. The tank circuit also includes a positive sense node for coupling to a sense line and a first inductor that has a first inductance electrically connected between the positive battery terminal and the positive sense node for blocking alternating current and radio frequency signals. In addition, the tank circuit also includes a negative sense node for coupling to an analog ground. The tank circuit additionally includes a varactor electrically connected across the negative sense node and the positive sense node and in parallel with the battery cell for providing a variable varactor capacitance dependent upon a cell voltage of the one of the plurality of battery cells.

According to yet another aspect of the disclosure, a method of operating a battery cell monitoring system is also provided. The method begins with the step of varying a variable varactor capacitance of a varactor of a tank circuit of each of a plurality of cell sense units electrically connected to one of the plurality of battery cells with the variable varactor capacitance dependent upon a on a cell parameter of interest of the one of the plurality of battery cells. The method continues with the step of varying a center frequency of the tank circuit including at least one inductor connected in series with the one of the plurality of battery cells between the varactor and the one of the plurality of battery cells in response to varying the variable varactor capacitance. Next, the method includes the step of determining the center frequency of the tank circuit of each of the plurality of cell sense units using a cell sense reader unit electrically coupled to the plurality of cell sense units through a sense line. The method concludes by determining the cell parameter of interest of each of the plurality of battery cells based on the center frequency of the tank circuit of each of the plurality of cell sense units determined using the cell sense reader unit.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

DETAILED DESCRIPTION

In the following description, details are set forth to provide an understanding of the present disclosure. In some instances, certain circuits, structures and techniques have not been described or shown in detail in order not to obscure the disclosure.

In general, the present disclosure relates to a battery cell monitoring system of the type well-suited for use in many applications. The battery cell monitoring system and associated methods of operation of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

Figure 1:
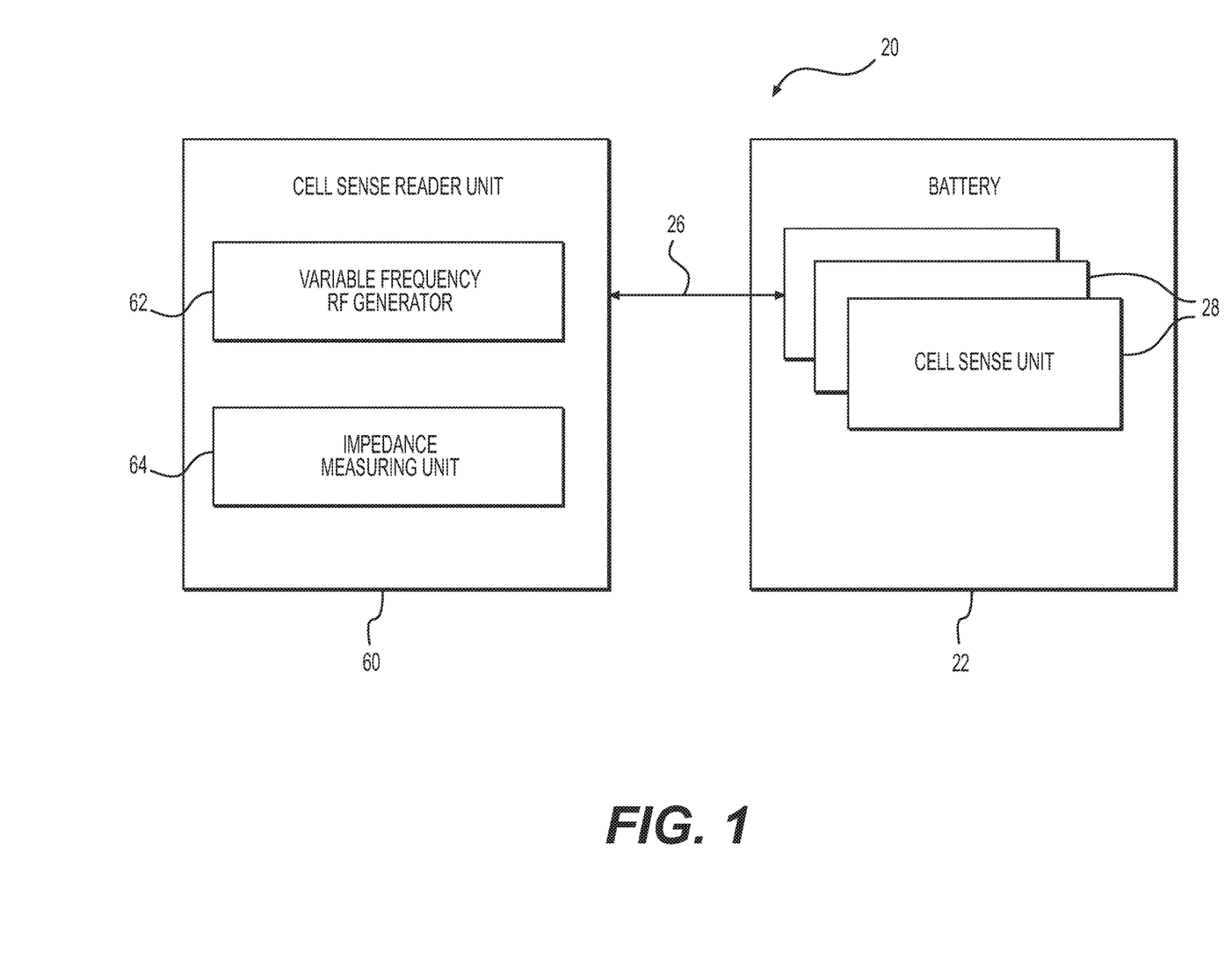
FIG. 1 illustrates a battery monitoring system according to aspects of the disclosure.
Figure 2:
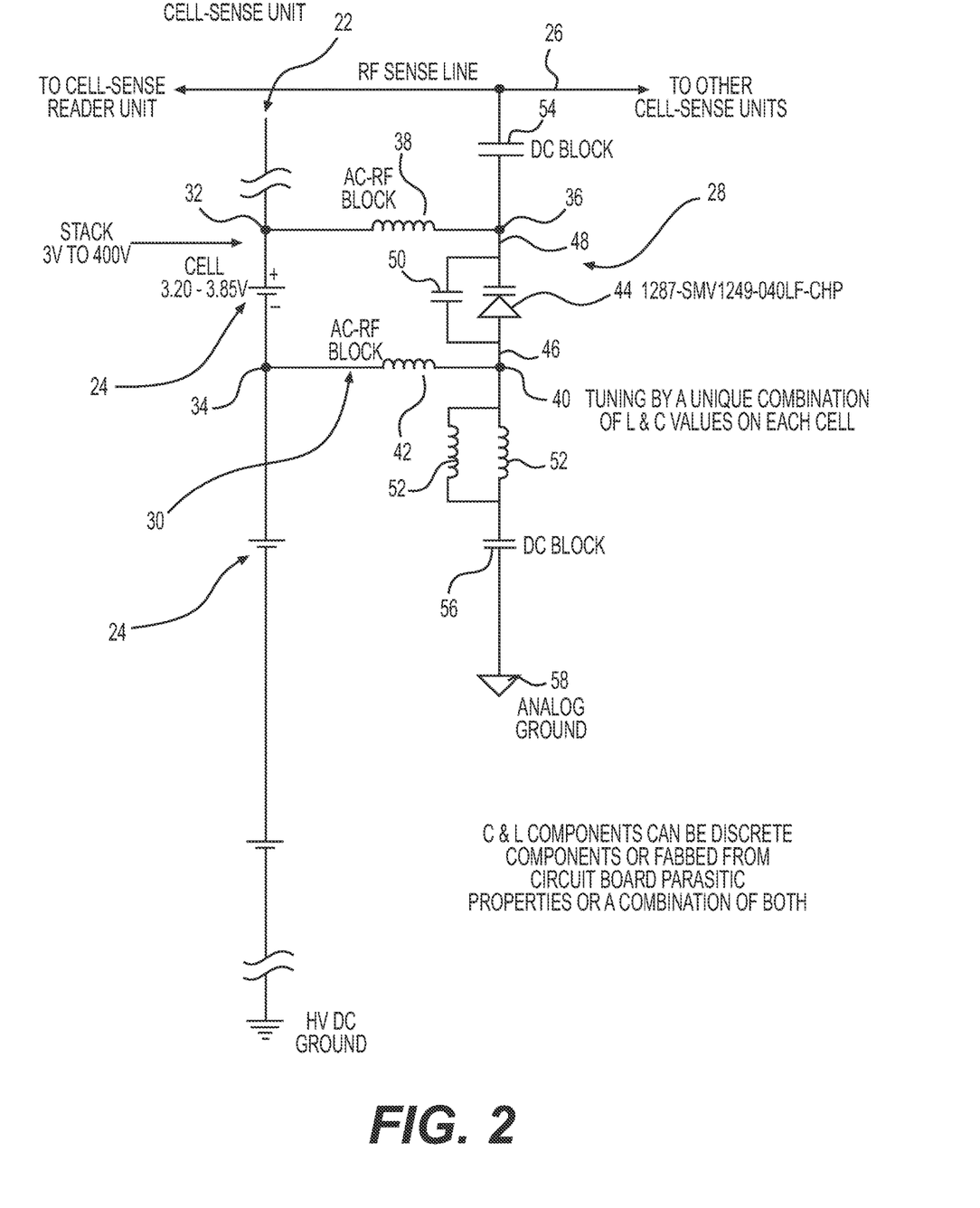
FIG. 2 illustrates a cell sense unit of the battery cell monitoring system of FIG. 1 according to aspects of the disclosure.

Referring to the Figures, wherein like numerals indicate corresponding parts throughout the several views, a battery cell monitoring system 20 for a battery 22 having a plurality of battery cells 24 is shown in FIGS. 1 and 2. The battery cell monitoring system 20 includes a radio frequency (RF) sense line or sense line 26.

A plurality of cell sense units 28 each include a tank circuit 30 that has a center frequency and is electrically connected to the sense line 26. As best illustrated in FIG. 2, the tank circuit 30 includes a positive battery node 32 for coupling to a positive terminal of one of the plurality of battery cells 24 and a negative battery node 34 for coupling to a negative terminal of the one of the plurality of battery cells 24. The tank circuit 30 also includes a positive sense node 36 and a first inductor 38 having a first inductance electrically connected between the positive terminal of the battery 22 and the positive sense node 36 for blocking alternating current and radio frequency signals. The tank circuit 30 further includes a negative sense node 40 and a second inductor 42 having a second inductance electrically connected between the negative terminal of the battery 22 and the negative sense node 40 for blocking alternating current and radio frequency signals.

The tank circuit 30 also includes a varactor 44 or voltage-variable capacitor electrically connected across the negative sense node 40 and the positive sense node 36. In more detail, the varactor 44 has a varactor anode 46 electrically connected to the negative sense node 40 and a varactor cathode 48 electrically connected to the positive sense node 36. Thus, the varactor 44 is arranged in parallel with the battery cell 24 for providing a variable varactor capacitance dependent upon a cell voltage, for example, of the one of the plurality of battery cells 24 (e.g., varies as a function of the cell voltage). Other arrangements of the varactor 44 are also possible. The tank circuit 30 additionally includes a parallel capacitor 50 electrically connected between the varactor anode 46 and the varactor cathode 48 in parallel with the varactor 44. So, the tank circuit 30 has a resonant or center frequency dependent on a cell parameter of interest (e.g., cell voltage of the battery cell 24 to which each of the plurality of cell sense units 28 is connected).

In the disclosed configuration, the resonant frequency of the tank circuit 30 is a function of the fixed inductor (L) and capacitor (C) components (e.g., the first inductor 38 and the second inductor 42 and the parallel capacitor 50) and the variable varactor capacitance of the varactor 44. As the cell voltage of each battery cell 24 changes, the resonant frequency of the tank circuit 30 changes due to the change of the variable varactor capacitance of the varactor 44. Each of the plurality of cell sense units 28 used in a multi-cell battery system (e.g., battery 22) is tuned to a different or unique nominal center frequency by varying the value of the inductors 38, 42, 52 and/or capacitors 50, 54, 56.

The plurality of cell sense units 28 also each include a first blocking capacitor 54 having a first blocking capacitance electrically connected between the positive sense node 36 and the sense line 26 for blocking direct current from the battery 22. A pair of inline inductors 52 each having an inline inductance are also connected in parallel with one another and are electrically connected to the negative sense node 40. In addition, the plurality of cell sense units 28 each include a second blocking capacitor 56 having a second blocking capacitance electrically connected between the pair of inline inductors 52 and an analog ground 58 for blocking direct current from the battery 22.

While the plurality of cell sense units 28 are realized as described above, each cell sense unit 28 can be implemented in a number of ways. For example, discrete components (e.g., inductors 38, 42, 52 and capacitors 50, 54, 56) can be disposed on a rigid or flexible circuit board. The cell sense unit 28 can thus include inductance and capacitance values from the discrete components, the circuit board or cell "parasitic" inductance and capacitance, or a combination of both. Alternatively, inductors 38, 42, 52 and capacitors 50, 54, 56 may be integrated on a single chip, for instance. The cell sense unit 28 can instead or additionally include a discrete or integrated circuit with active components to create a marginal oscillator responsive to cell parameters or a discrete or integrated circuit with active components to buffer read-line radio frequencies into or out of the cell sense unit 28. Existing structures in the battery cell 24 may also be used as part of the resonant circuit (i.e., tank circuit 30). Sensing multiple cell parameters may additionally be done simultaneously by using an RLC circuit and independently varying the R, L and C responsive to cell parameters.

As best illustrated in FIG. 1, a cell sense reader unit 60 is electrically coupled to the sense line 26 and includes a variable frequency radio frequency generator 62 for outputting a radio frequency signal having a signal frequency that is variable to the plurality of cell sense units 28 (e.g., through the sense line 26). So, the disclosed battery cell monitoring system 20 utilizes bounded media (i.e., wiring) to create a radio frequency connection between the cell sense reader unit 60 and the plurality of cell sense units 28. It should be appreciated that while the battery cell monitoring system 20 can use bounded media, it alternatively may utilize unbounded media (i.e., wireless). So, communication between the cell sense reader unit 60 and the cell sense units 28 can be with bounded or unbounded media.

The cell sense reader unit 60 is also configured to measure an impedance of the sense line 26 as the signal frequency varies and determine the center frequency of each of the plurality of cell sense units 28. Thus, the cell sense reader unit 60 consists of the variable frequency radio frequency generator 62 feeding the sense line 26, and an impedance measuring unit 64 for reading the impedance of the sense line 26. In operation, the cell sense reader unit 60 sweeps the frequency of the variable frequency radio frequency generator 62 and measures the impedance of the sense line 26 during the sweep operation. The impedance varies with frequency as the different cell sense units 28 connected to the sense line 26 respond (e.g., resonate) to the radio frequency sweep signal. The resulting impedance measurement during the radio frequency sweep indicates the center frequency of each cell sense unit 28 connected to the sense line 26. Said another way, a multiplicity of cell parameter transducers (i.e., the cell sense units 28) are read by a single analog to digital converter (i.e., the cell sense reader unit 60). This forms the overall battery cell monitoring system 20 with multiple transducers and few converters.

In addition, the cell sense reader unit 60 is configured to determine a cell voltage of each of the plurality of battery cells 24 respectively electrically connected to one of the plurality of cell sense units 28 based on the center frequency determined. Specifically, by analysis of the center frequency of each cell sense unit 28, the cell voltage of each battery cell 24 in the battery 22 can be determined due to the shift in center frequency caused by the variable varactor capacitance of the varactor 44 driven by the cell voltage. The result of this analysis can be communicated digitally for use by battery monitoring and control algorithms.

The cell sense reader unit 60 can be implemented in a number of ways. For example, in one instance, the cell sense reader unit 60 can be implemented using a microcontroller with analog inputs and outputs, which are used to generate the radio frequency signal and read the impedance of the sense line 26. Additionally, the cell sense reader unit 60 can use a swept sine wave to identify the center frequency of each cell sense unit 28, for example. Alternatively, the cell sense reader unit 60 can use a pseudo-random noise signal and a frequency analysis method to identify the overall frequency response of the impedance of the sense line 26 or an impulse signal and an impulse response analysis to identify the overall frequency response of the sense line 26. The cell sense reader unit 60 can also sense multiple cell parameters by using a complex impedance measurement to identify R, L, and C values in each cell sense unit 28.

Furthermore, other cell parameters such as cell current or cell temperature can be measured by using circuit elements sensitive to current or temperature connected to form the tank circuit 30 with a varying resonant frequency. For example, cell current can be sensed by using a connected hall-effect sensor to produce a varying voltage responsive to the magnetic field associated with the cell current flow. The hall voltage can, in turn, vary the capacitance of a varactor 44 in the tank circuit 30.

The battery cell monitoring system 20 could also be implemented by reading cell voltage using a digital circuit (not shown) that is activated by a digital code from cell sense reader unit 60. This digital circuit responds to that activation by measuring and transmitting cell parameters of interest. The digital circuit may contain an analog to digital converter to determine cell voltage for transmission or may contain an analog means of measuring and transmitting cell voltage. This could be a voltage controlled oscillator that is turned on when the digital code is received.

Figure 3:
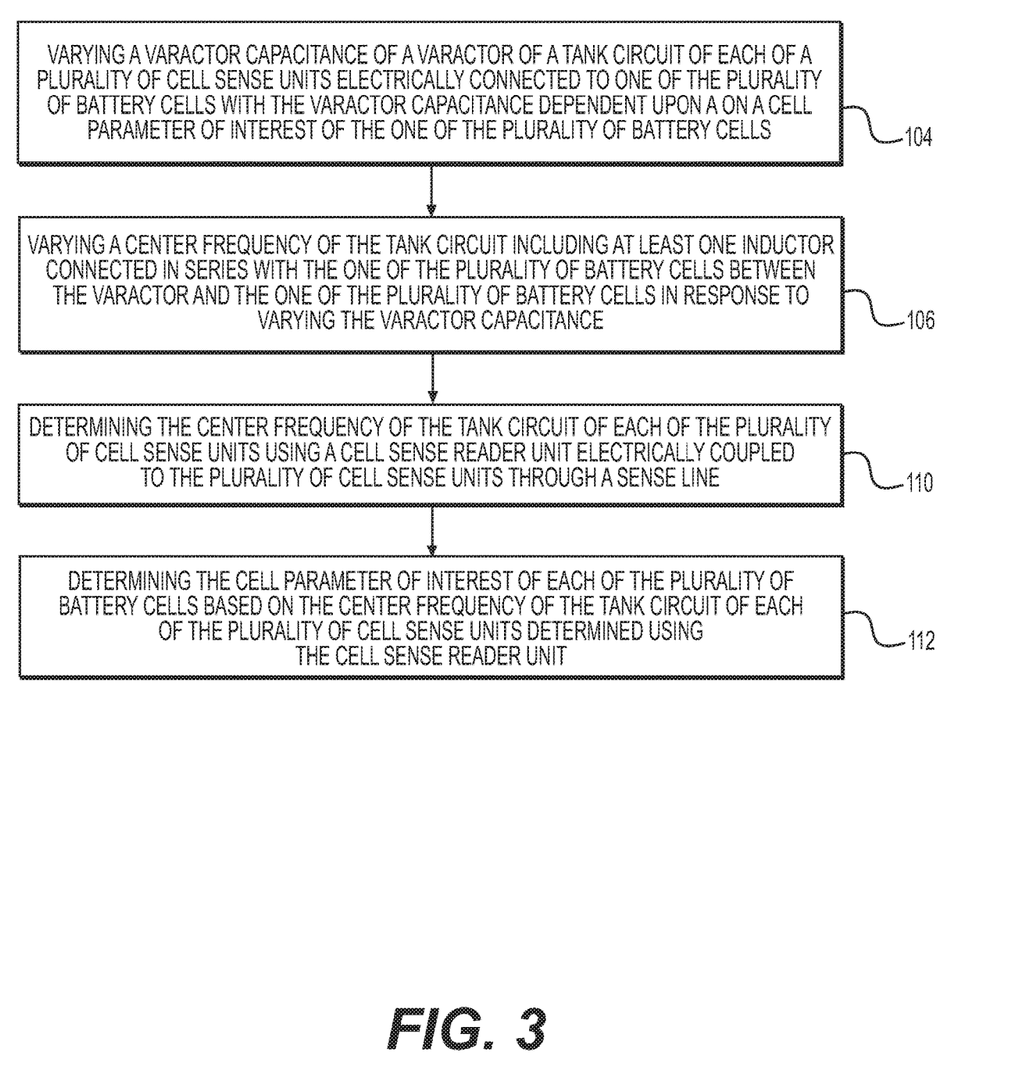
FIGS. 3 and 4 illustrate a method of operating the battery cell monitoring system of FIGS. 1 and 2 according to aspects of the disclosure.
Figure 4:
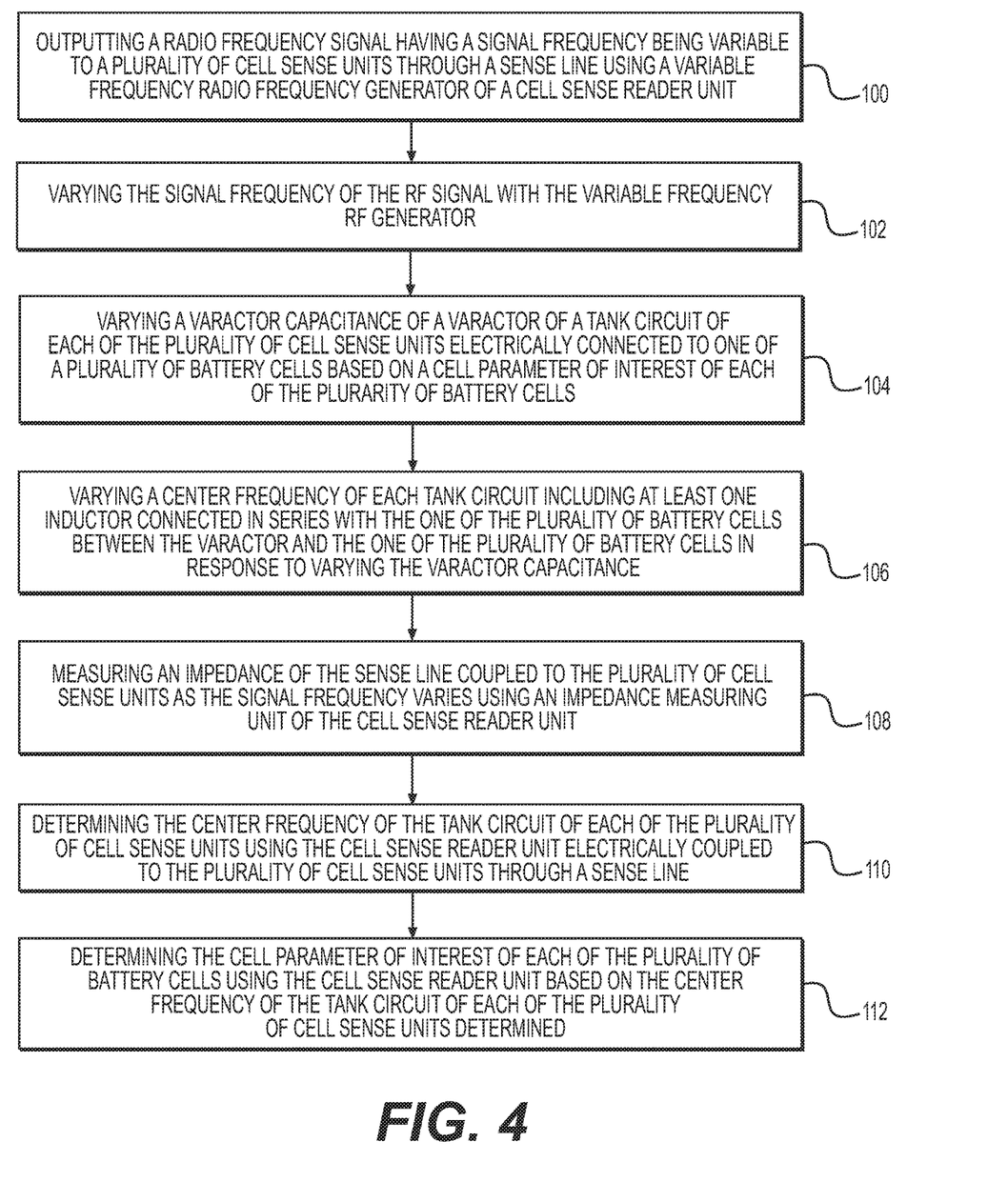

As best shown in FIGS. 3 and 4, a method of operating a battery cell monitoring system 20 is also provided. The method includes the step of 100 outputting a radio frequency signal having a signal frequency being variable to a plurality of cell sense units 28 through a sense line 26 using a variable frequency radio frequency generator 62 of a cell sense reader unit 60. The method proceeds by 102 varying the signal frequency of the radio frequency signal with the variable frequency radio frequency generator 62.

The method continues with the step of 104 varying a variable varactor capacitance of a varactor 44 of a tank circuit 30 of each of the plurality of cell sense units 28 electrically connected to one of a plurality of battery cells 24 based on a cell parameter of interest (e.g., cell voltage) of each of the plurality of battery cells 24. The next step of the method is 106 varying a center frequency of each tank circuit 30 including at least one inductor 38, 42 connected in series with the one of the plurality of battery cells 24 between the varactor 44 and the one of the plurality of battery cells 24 in response to varying the variable varactor capacitance.

The method proceeds with the step of 108 measuring an impedance of the sense line 26 coupled to the plurality of cell sense units 28 as the signal frequency varies using the cell sense reader unit 60. Specifically, the method could also include the step of measuring a complex impedance to sense multiple cell parameters of interest of the one of the plurality of battery cells 24 by identifying at least one of a resistance and an inductance and a capacitance of each of said plurality of cell sense units 28 using the cell sense reader unit 60. Then, 110 determining the center frequency of the tank circuit 30 of each of the plurality of cell sense units 28 using a cell sense reader unit 60 electrically coupled to the plurality of cell sense units 28 through a sense line 28.

The method concludes with the step of 112 determining the parameter of interest (e.g., cell voltage) of each of the plurality of battery cells 24 based on the center frequency of the tank circuit 30 of each of the plurality of cell sense units 28 determined using the cell sense reader unit 60.

Clearly, changes may be made to what is described and illustrated herein without, however, departing from the scope defined in the accompanying claims. The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure. Those skilled in the art will recognize that concepts disclosed in association with the example battery monitoring system can likewise be implemented into many other systems to control one or more operations and/or functions.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

What is claimed is:

1. A battery cell monitoring system for a battery having a plurality of battery cells comprising:
    a sense line;
    a plurality of cell sense units each including a tank circuit electrically connected to one of the plurality of battery cells and to said sense line, wherein said tank circuit has a center frequency dependent on a cell parameter of interest of the one of the plurality of battery cells;
    a cell sense reader unit electrically coupled to said plurality of cell sense units through said sense line and configured to determine the center frequency of said tank circuit of each of said plurality of cell sense units and consequently determine the cell parameter of interest of each of the plurality of battery cells; and
    said tank circuit of each of said plurality of cell sense units including a varactor electrically connected with the one of the plurality of battery cells for providing a variable varactor capacitance dependent upon the cell parameter of interest of the one of the plurality of battery cells and at least one inductor connected in between the one of the plurality of battery cells and said varactor.

2. The battery cell monitoring system as set forth in claim 1, wherein said cell sense reader unit includes a variable frequency radio frequency generator for outputting a radio frequency signal having a signal frequency being variable to said plurality of cell sense units and wherein said cell sense reader unit is configured to measure an impedance of said sense line as the signal frequency varies.

3. The battery cell monitoring system as set forth in claim 2, wherein said cell sense reader unit is configured to:
    determine the center frequency of said tank circuit of each of said plurality of cell sense units based on the impedance measured, and
    determine a cell voltage of each of the plurality of battery cells based on the center frequency determined.

4. The battery cell monitoring system as set forth in claim 1, wherein said tank circuit includes a positive sense node coupled to said sense line and said at least one inductor includes a first inductor having a first inductance electrically connected between a positive battery terminal of the one of the plurality of battery cells and said positive sense node for blocking alternating current and radio frequency signals and said tank circuit includes a negative sense node for coupling to an analog ground and said at least one inductor includes a second inductor having a second inductance electrically connected between a negative battery terminal of the one of the plurality of battery cells and said negative sense node for blocking alternating current and radio frequency signals and said varactor is electrically connected across said negative sense node and said positive sense node.

5. The battery cell monitoring system as set forth in claim 4, further including a first blocking capacitor having a first blocking capacitance electrically connected between said positive sense node and said sense line for blocking direct current from the battery.

6. The battery cell monitoring system as set forth in claim 5, further including a pair of inline inductors each having an inline inductance in parallel with one another and electrically connected to said negative sense node.

7. The battery cell monitoring system as set forth in claim 6, further including a second blocking capacitor having a second blocking capacitance electrically connected between said pair of inline inductors and an analog ground for blocking direct current from the battery.

8. The battery cell monitoring system as set forth in claim 4, wherein said varactor has a varactor anode electrically connected to said negative sense node and a varactor cathode electrically connected to said positive sense node.

9. The battery cell monitoring system as set forth in claim 8, wherein said tank circuit includes a parallel capacitor electrically connected between said varactor anode and said varactor cathode in parallel with said varactor.

10. The battery cell monitoring system as set forth in claim 1, wherein said cell sense reader unit is configured to sense multiple cell parameters of interest of the one of the plurality of battery cells using a complex impedance measurement to identify at least one of a resistance and an inductance and a capacitance of each of said plurality of cell sense units.

11. The battery cell monitoring system as set forth in claim 1, wherein each of the plurality of cell sense units is tuned to a unique center frequency.

12. The battery cell monitoring system as set forth in claim 1, wherein said cell sense reader unit is configured to determine the center frequency of said tank circuit of each of said plurality of cell sense units using at least one of a swept sine wave and a pseudo-random noise signal.

13. A cell sense unit of a battery cell monitoring system for a battery cell of a battery, comprising:
    a tank circuit having a center frequency and including a positive battery node for coupling to a positive terminal of one of the plurality of battery cells and a negative battery node for coupling to a negative terminal of the one of the plurality of battery cells;

said tank circuit including a positive sense node for coupling to a sense line;

said tank circuit including a negative sense node for coupling to an analog ground;

said tank circuit including a varactor electrically connected across said negative sense node and said positive sense node and in parallel with the battery cell, wherein said varactor has a varactor anode electrically connected to said negative sense node and a varactor cathode electrically connected to said positive sense node for providing a variable varactor capacitance dependent upon a cell voltage of the one of the plurality of battery cells; and said tank circuit including a first inductor having a first inductance electrically connected directly between the positive battery terminal and said varactor cathode and a second inductor having a second inductance electrically connected between the negative battery terminal and said varactor anode for blocking alternating current and radio frequency signals.

14. The cell sense unit as set forth in claim 13, wherein said tank circuit includes a parallel capacitor electrically connected between said varactor anode and said varactor cathode in parallel with said varactor.

15. A method of operating a battery cell monitoring system for a battery having a plurality of battery cells comprising the steps of:

varying a variable varactor capacitance of a varactor of a tank circuit of each of a plurality of cell sense units electrically connected to one of the plurality of battery cells with the variable varactor capacitance dependent on a cell parameter of interest of the one of the plurality of battery cells;

varying a center frequency of the tank circuit including at least one inductor connected in between the one of the plurality of battery cells and the varactor in response to varying the variable varactor capacitance;

determining the center frequency of the tank circuit of each of the plurality of cell sense units using a cell sense reader unit electrically coupled to the plurality of cell sense units through a sense line; and determining the cell parameter of interest of each of the plurality of battery cells based on the center frequency of the tank circuit of each of the plurality of cell sense units determined using the cell sense reader unit.

16. The method as set forth in claim 15, further including the steps of:

outputting a radio frequency signal having a signal frequency being variable to the plurality of cell sense units through the sense line using a variable frequency radio frequency generator of the cell sense reader unit; and varying the signal frequency of the radio frequency signal with the variable frequency radio frequency generator.

17. The method as set forth in claim 16, further including the step of measuring an impedance of the sense line coupled to the plurality of cell sense units as the signal frequency varies using the cell sense reader unit.

18. The method as set forth in claim 15, wherein the varactor of the tank circuit is connected in parallel with the one of the plurality of battery cells and the cell parameter of interest is a cell voltage of the one of the plurality of battery cells.

19. The method as set forth in claim 15, further including the step of measuring a complex impedance to sense multiple cell parameters of interest of the one of the plurality of battery cells by identifying at least one of a resistance and an inductance and a capacitance of each of said plurality of cell sense units using the cell sense reader unit.

20. The method as set forth in claim 15, further including the step of blocking direct current from the battery using a blocking capacitor having a blocking capacitance electrically coupled to an analog ground.

* * * * *